United States Patent
Bruchhaus et al.

[11] Patent Number: 6,139,971
[45] Date of Patent: Oct. 31, 2000

[54] STRATIFIED STRUCTURE WITH A FERROELECTRIC LAYER AND PROCESS FOR PRODUCING THE SAME

[75] Inventors: Rainer Bruchhaus, München; Dana Pitzer, Unterschleissheim, both of Germany

[73] Assignee: Siemens Aktiengesellschaft, Munich, Germany

[21] Appl. No.: 09/214,809
[22] PCT Filed: Jul. 2, 1997
[86] PCT No.: PCT/DE97/01396
 § 371 Date: Jan. 12, 1999
 § 102(e) Date: Jan. 12, 1999
[87] PCT Pub. No.: WO98/05062
 PCT Pub. Date: Feb. 5, 1998

[30] Foreign Application Priority Data

Jul. 25, 1996 [DE] Germany ............... 196 30 110

[51] Int. Cl.⁷ .................................................. B32B 17/00
[52] U.S. Cl. ...................... 428/446; 428/469; 428/701; 428/702; 427/576; 427/314
[58] Field of Search ....................... 428/446, 469, 428/701; 420/702; 427/576, 314

[56] References Cited

U.S. PATENT DOCUMENTS 5,554,866  9/1996  Nishioka et al. .
5,654,222  8/1997  Sandhu et al. .

FOREIGN PATENT DOCUMENTS

| 0 698 918 A1 | 2/1996 | European Pat. Off. . |
| 43 28 067 C1 | 3/1994 | Germany . |
| 195 15 347 A1 | 2/1995 | Germany . |
| WO 93/18530 | 9/1993 | WIPO . |

OTHER PUBLICATIONS

Proc. 4$^{th}$ International Symposium on Integrated Ferroelectrics, Mar. 9–11, 1992, Montery, CA (USA), H. N. AL–Shareef et al, "Bottom Electrodes for Ferroelectric Thin Films", pp. 181–196.

Materials Research Society Proc., vol. 361, (1995), Scott R. Summerfelt et al, "Pt Hillock Formation and Decay", pp. 257–263.

Japanese Journal of applied Physics, vol. 26, No. 4, Apr., 1987, Masatoshi Adachi et al, Sputter–Deposition of [111] –Axis Oriented Rhombohedral PZT Films and Their Dielectric, Ferroelectric and Pyroelectric Properties, pp. 550–553.

Primary Examiner—Timothy M. Speer
Attorney, Agent, or Firm—Hill & Simpson

[57] ABSTRACT

A layer structure has a substrate, a platinum layer and a ferroelectric layer. In order to improve adhesion between the platinum layer and the substrate, the structure has an intermediate layer of amorphous aluminum oxide. The intermediate layer also improves the morphology of the ferroelectric layer and ensures that the layer structure is uniform.

11 Claims, 2 Drawing Sheets

STRATIFIED STRUCTURE WITH A FERROELECTRIC LAYER AND PROCESS FOR PRODUCING THE SAME

BACKGROUND OF THE INVENTION

Ferroelectric layers are employed in components, use being made of the dielectric, pyroelectric and piezoelectric properties of ferroelectrics. Examples of components having ferroelectric layers include capacitors, pyrodetectors, piezo-actuators or semiconductor memories, it being possible in the latter case for the ferroelectric layers to be used both as a dielectric and as a storage medium by exploiting the hysteresis effect in relation to polarization.

European reference EP 0 698 918 A discloses a microelectronic layer structure which consists of an oxidizable substrate, an electrode and a dielectric having high dielectric constant. An isolating layer is arranged between the electrode and the substrate. The isolating layer, which for example consists of a noble-metal/insulator alloy and must be electrically conductive, has the primary purpose of limiting diffusion of oxygen to the surface of the substrate.

Great importance has been placed on components having thin films of ferroelectrics, which can be produced with a high degree of structural quality. To this end, it is customary to produce a first electrode layer on a substrate, and the ferroelectric layer on top using conventional thin-film processes. Platinum is particularly suitable as the electrode material for the electrode lying below the ferroelectric layer, since this material can withstand the deposition conditions for the ferroelectric layer, at high temperatures and in an oxygen-containing atmosphere, without sustaining damage and does not cause any diffusion into the ferroelectric layer, which might cause a change in composition and therefore a change in properties.

When silicon-containing substrates are used, the problem arises that platinum exhibits only moderate adhesion to silicon oxide. For the production of storage capacitors having platinum electrodes, titanium adhesion layers have therefore already been proposed, which are arranged between the platinum electrode and the substrate surface containing silicon oxide (see, for example, H. N. Al-Shareef et al., Proc. 4th International Symposium on Integrated Ferroelectrics, Mar. 9–11, 1992, pages 181–196, Montery, Calif., USA).

However, titanium-containing adhesion layers entail a number of disadvantages, leading to degradation of the electrical properties of ferroelectric capacitors and, in general, of ferroelectric components. Good ferroelectric properties are obtained only with ferroelectrics which contain crystalline oxides and are produced at elevated temperature in oxygen-containing atmospheres. In this case, however, diffusion of titanium into the platinum and subsequent oxidation of the titanium to form titanium oxide $TiO_2$ are observed. This entails a quite significant increase in volume, which causes the formation of so-called hillocks on the surface of the platinum electrode. These structural irregularities continue in a ferroelectric layer applied on top, cause an unfavorable morphology in it and therefore lead to unfavorable electric and ferroelectric properties. In the extreme case, the structural irregularity of the platinum electrode is so great as to bring about a short-circuit in the ferroelectric component, and therefore complete failure of the component.

SUMMARY OF THE INVENTION

The object of the present invention is therefore to provide a layer structure having a ferroelectric layer, which has a good and even surface morphology as well as good adhesion to the substrate.

In general terms the present invention is a layer structure having at least a substrate, a platinum layer, and a ferroelectric layer arranged on the platinum layer. An intermediate layer of amorphous $Al_2O_3$ is arranged between the substrate and the platinum layer.

Advantageous developments of the present invention are as follows.

The surface of the substrate is silicon dioxide.

The substrate comprises monocrystalline silicon having a surface layer of silicon dioxide.

The intermediate layer has a thickness in the range of 10 nm to about 1000 nm.

The ferroelectric layer is selected from the material system $Pb(Zr,Ti)O_3$.

The present invention is also a process for the production of a layer structure having a substrate, a platinum layer and a ferroelectric layer arranged on the platinum layer. An intermediate layer of $Al_2O_3$ is deposited between the substrate and the platinum layer using a thin-film process. In a further embodiment the intermediate layer is deposited when the substrate temperature is between 100° C. and 300° C.

The ferroelectric layer is deposited in an oxygen-containing plasma when the substrate temperature is at least 450° C.

The platinum layer is deposited when the substrate temperature is between 100° C. and 300° C.

The present invention encompasses the use of the layer structure for the production of ferroelectric thin-film components such as pyrodetectors, capacitors or memories.

It has unexpectedly been found that a layer structure which has an amorphous aluminum oxide intermediate layer, a platinum layer and a ferroelectric layer on top, and is arranged on a substrate, on the one hand exhibits very good adhesion and on the other hand results in a ferroelectric layer having a very good surface morphology. The surface of the ferroelectric layer is free from hillocks and exhibits a more regular, more uniform grain structure than a structure having a titanium-containing intermediate layer. Moreover, a ferroelectric layer having a more uniform structure exhibits better ferroelectric properties, is easier to polarize and permits a greater lasting degree of polarization than a ferroelectric layer with a more nonuniform structure.

The term amorphous aluminum oxide layer is in this case intended to mean an $Al_2O_3$ layer which is produced using a thin-film deposition process and may also be microcrystalline. The degree of (micro)crystallinity is in this case dependent on the chosen deposition temperatures (substrate temperatures), which may for example be up to 300° C.

The layer structure according to the invention, and the uniform surface morphology which can thereby be achieved for the ferroelectric layer, allows the ferroelectric layer to be configured more thinly in ferroelectric components than known hitherto. Even with thin ferroelectric layers, there is no risk of short-circuit due to structural irregularities. The invention also makes it possible to produce ferroelectric multilayer components, for example capacitors with multilayer structure, in simple fashion without increasing the structural irregularities of the individual layers exponentially as the number of layers in the stack becomes greater. A ferroelectric capacitor having a layer structure according to the invention can be produced with a thinner ferroelectric layer and therefore a higher capacitance than is the case with a known layer structure.

The aluminum oxide of the intermediate layer does not exhibit any diffusion into the neighboring platinum layer and readily withstands the production temperature of ferroelectric layers, up to 800° C. or more in an oxidizing atmosphere. It is also so chemically inert that there is no risk of reactions with constituents of the ferroelectric, which may themselves diffuse through the platinum layer.

Even an intermediate layer with a thickness of as little as about 10 nm exhibits an advantageous effect. A preferred thickness for the intermediate layer is between 20 and 120 nm. Higher thicknesses for the intermediate layer are neither necessary nor desirable, since disadvantages may again arise as the thickness of the intermediate layer increases. A thinner intermediate layer is faster and more economical to apply, while a higher layer thickness entails a higher heat capacity as well as an increased thermal dissipation capacity, which is disadvantageous in pyroelectric components.

An aluminum oxide intermediate layer leads to improved adhesion for all conventional substrate materials, but in particular for substrates whose surfaces comprise silicon oxide or silicon nitride. The invention is therefore particularly suitable for all ferroelectric layer structures, and components produced therefrom, above silicon substrates which customarily have a silicon oxide surface layer. Even pyrodetectors which are built on a membrane layer comprising silicon nitride are advantageously realized using the invention.

A thin-film process, preferably sputtering, is used to apply the aluminum oxide intermediate layer. The substrate temperature is in this case set, for example, to from 200° to 300° C.

The platinum layer may likewise be applied using any desired thin-film processes, for example by vacuum evaporation, electron beam evaporation or by (BIAS) sputtering. When the substrate temperature is, for example, between 100° C. and 300° C., a platinum layer with (111) texture is in this way obtained. This texture in turn permits a likewise textured and dense growth of a ferroelectric layer over the platinum layer. At a temperature of at least 450° C. in an oxygen-containing atmosphere, it is possible to produce a ferroelectric layer which is already self-polarized after sputtering. In principle, however, other processes may also be used for producing the ferroelectric layer, for example CVD and sol-gel processes.

The use of a sputtering process for applying the intermediate layer and the platinum layer has the advantage that the intermediate layer and the platinum layer can be applied in the same sputtering system. Otherwise, removal of the substrates from the system could lead to the formation of undesired monomolecular layers when exposed to the atmosphere, which could lead to negative effects on the composition and properties of the layer structure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

The invention will be explained in more detail below with the aid of an illustrative embodiment and the associated three figures.

DESCRIPTION OF THE PREFERRED EMBODIMENTS

Figure 1:
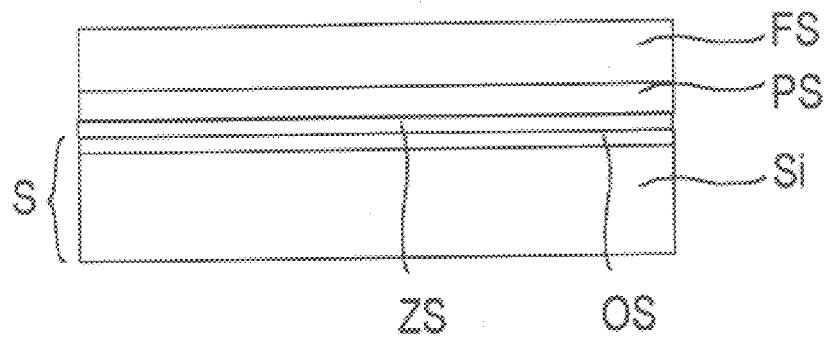
FIG. 1 shows a layer structure according to the invention in schematic cross section.

FIG. 1: An arbitrary substrate, for example silicate glass or a silicon wafer Si is used as the substrate S. The wafer may comprise a surface layer OS of silicon oxide $SiO_2$ or of silicon nitride $Si_3N_4$. The thickness of this surface layer OS is irrelevant to the adhesion and morphology of the layers to be applied thereon.

Over the surface layer OS, the intermediate layer ZS is applied with a thickness of from 10 nm to about 120 nm, for example by sputtering $Al_2O_3$ when the substrate temperature is from 100° C. to about 300° C.

The platinum layer PS is applied on top, preferably also by sputtering when the substrate temperature is at least 100° to about 300° C. Depending on the intended use of the layer structure, the platinum layer PS will be applied with a suitable thickness, but in any case with the smallest appropriate thickness, for example 0.1 $\mu$m to 0.5 $\mu$m.

The ferroelectric layer FS applied on top consists of a ferroelectric material, preferably from the lead-containing titanate group, which may further contain various additives from the group consisting of the alkaline earth metals or zirconium. The most well known of these ferroelectric materials which can be produced with the perovskite structure is lead zirconate titanate (PZT). The thickness of the ferroelectric layer FS is irrelevant in terms of its adhesion and morphology. A ferroelectric layer thickness of from 200 nm to about 2 $\mu$m is sufficient for ferroelectric components.

Figure 2:
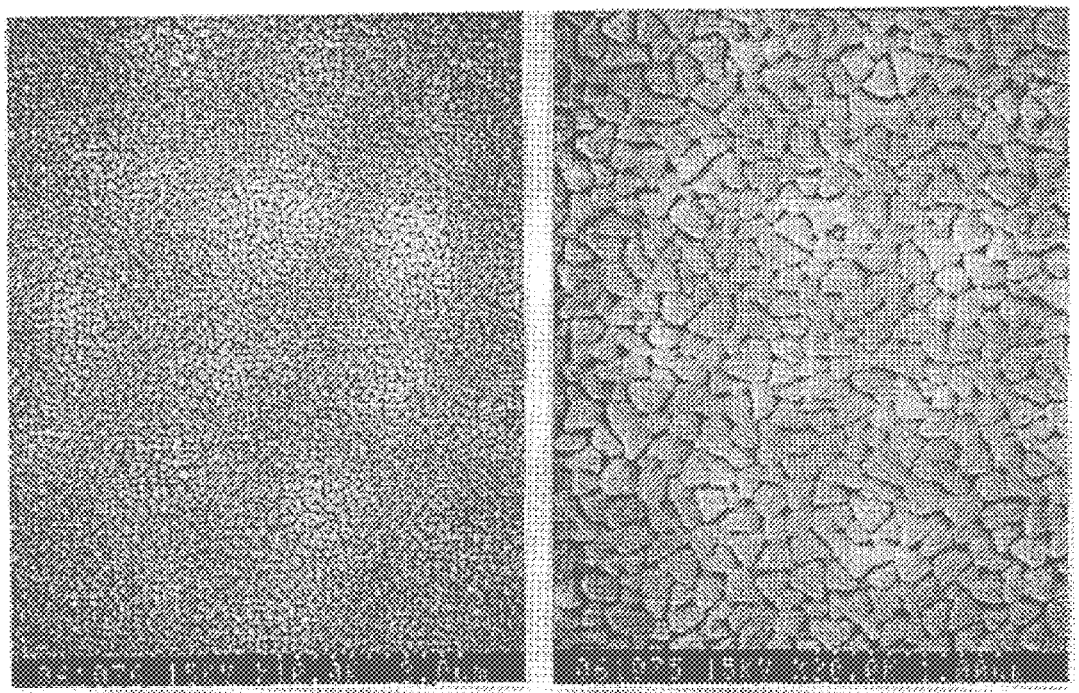
FIG. 2 shows an SEM picture of the surface of a layer structure according to the invention.

In an SEM picture, FIG. 2 shows the surface structure of the ferroelectric layer of the layer structure according to the invention at two resolution.

Figure 3:
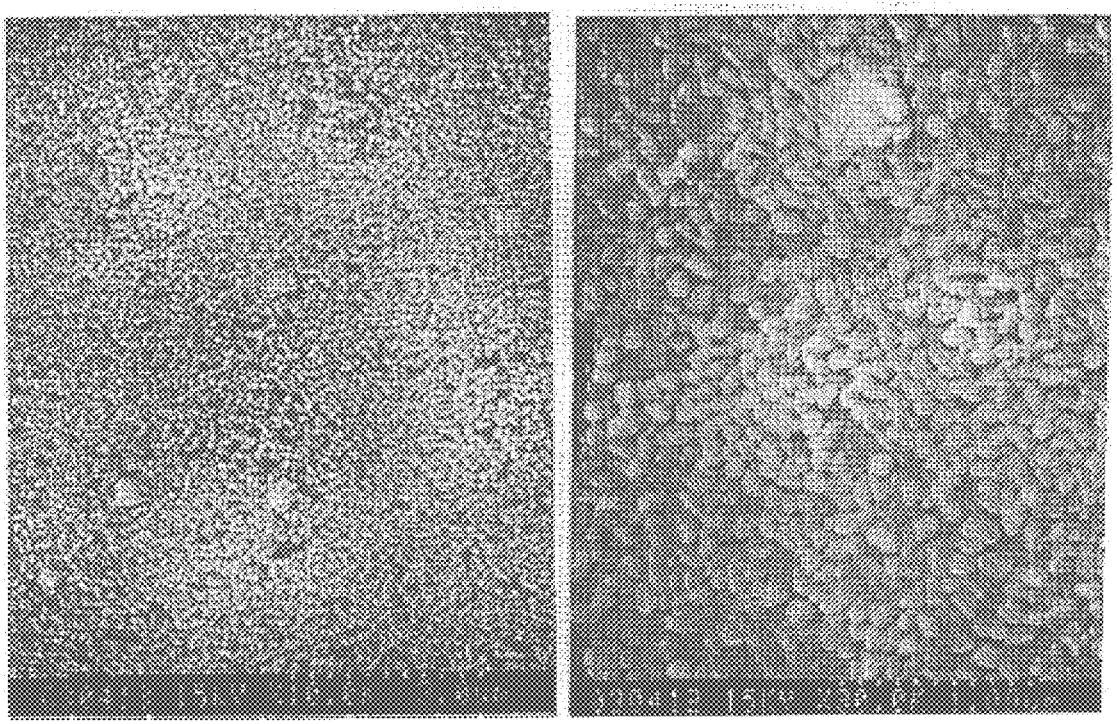
FIG. 3 shows the surface of a prior art layer structure with titanium-containing intermediate layer.

For comparison, FIG. 3 illustrates the surface structure of a ferroelectric layer of a known layer structure with a titanium-containing intermediate layer as an SEM picture. As direct comparison clearly shows, the ferroelectric layer of the layer structure according to the invention (FIG 2) has a more uniform grain structure and no structural defects (hillocks). The surface structure of the known layer structure (FIG. 3) is, conversely, clearly nonuniform and also shows some hillocks which, in the form of particularly large grains protruding from the surface and greatly impair the evenness of the surface.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A layer structure comprising:
   a substrate having a first surface;
   an intermediate layer of amorphous $Al_2O_3$ on said first surface;
   a platinum layer on said intermediate layer; and
   a ferroelectric layer arranged on the platinum layer, said intermediate layer and said platinum layer being deposited with the substrate having a temperature in a range of 100° C. to 300° C. so that the platinum layer has a texture of (1) and the ferroelectric layer has a uniform grain structure free of hillocks.

2. The layer structure as claimed in claim 1, wherein the surface of the substrate is silicon dioxide.

3. The layer structure as claimed in claim 1, wherein the substrate comprises monocrystalline silicon having a surface layer of silicon dioxide.

4. The layer structure as claimed in claim 1, wherein the intermediate layer has a thickness in the range of approximately 10 nm to 1000 nm.

5. The layer structure as claimed in claim 1, wherein the ferroelectric layer is a material from the material system Pb (Zr, Ti) $O_3$.

6. A process for producing a layer structure comprising the steps of:

providing a heated substrate at a temperature in a range of 100° C. to 300° C.;

depositing an intermediate layer on a surface of the heated substrate;

depositing a platinum layer on the intermediate layer with the heated substrate having a temperature in a range of 100° C. to 300° C.; and then depositing a ferroelectric layer on the platinum layer.

7. The process as claimed in claim 6, wherein the ferroelectric layer is deposited in an oxygen-containing plasma when the substrate temperature is at least 450° C.

8. A ferroelectric thin-film component, comprising:

a substrate having a first surface;

an intermediate layer of amorphous $Al_2O_3$ on the first surface;

a platinum layer on the intermediate layer; and a ferroelectric layer on the platinum layer, said intermediate layer and said platinum layer being deposited with the substrate heated to a temperature in a range of 100° C. to 300° C. so that the platinum layer has a texture of (111) and the ferroelectric layer is free of hillocks and has a uniform grain structure.

9. The ferroelectric thin-film component as claimed in claim 8, wherein the component is a pyrodetector.

10. The ferroelectric thin-film component as claimed in claim 8, wherein the component is a capacitor.

11. The ferroelectric thin-film component as claimed in claim 8, wherein the component is a memory.

\* \* \* \* \*